US009899477B2

(12) United States Patent
Turner et al.

(10) Patent No.: US 9,899,477 B2
(45) Date of Patent: Feb. 20, 2018

(54) EDGE TERMINATION STRUCTURE HAVING A TERMINATION CHARGE REGION BELOW A RECESSED FIELD OXIDE REGION

(71) Applicant: Infineon Technologies Americas Corp., El Segundo, CA (US)

(72) Inventors: Russell Turner, Monmouthshire (GB); Rajeev Krishna Vytla, Los Angeles, CA (US); Luther-King Ngwendson, Newport (GB); Nicholas Limburn, Newport (GB)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/790,905

(22) Filed: Jul. 2, 2015

(65) Prior Publication Data

US 2016/0020308 A1  Jan. 21, 2016

Related U.S. Application Data

(60) Provisional application No. 62/026,510, filed on Jul. 18, 2014.

(51) Int. Cl.
*H01L 29/43* (2006.01)
*H01L 29/10* (2006.01)
(Continued)

(52) U.S. Cl.
CPC ...... *H01L 29/1095* (2013.01); *H01L 29/0619* (2013.01); *H01L 29/0623* (2013.01);
(Continued)

(58) Field of Classification Search
CPC .......... H01L 21/02164; H01L 29/0619; H01L 29/0623; H01L 29/0696; H01L 29/1095;
(Continued)

(56) References Cited

U.S. PATENT DOCUMENTS

| 4,927,772 A | 5/1990 | Arthur |
| 6,215,168 B1 | 4/2001 | Brush |

(Continued)

FOREIGN PATENT DOCUMENTS

| EP | 0580213 A1 | 1/1994 |
| EP | 1071135 A2 | 1/2009 |

(Continued)

OTHER PUBLICATIONS

Kao et al. *High-Voltage Planar p-n Junction*; Proceedings of the IEEE, vol. 55, No. 8, Aug. 1967, pp. 1409-1414.
(Continued)

*Primary Examiner* — Hung Vu
(74) *Attorney, Agent, or Firm* — Murphy, Bilak & Homiller, PLLC (57) ABSTRACT

An edge termination structure is disclosed. The edge termination structure includes an active cell in a semiconductor wafer, an edge termination region adjacent the active cell in the semiconductor wafer, where the edge termination region includes a recessed field oxide region and a termination charge region below the recessed field oxide region. The recessed field oxide region may be thermally grown in a recess in the semiconductor wafer. A top surface of the recessed field oxide region is substantially coplanar with a top surface of the semiconductor wafer. The active cell may include at least one insulated-gate bipolar transistor surrounded by the edge termination region in the semiconductor wafer. The termination charge region has a conductivity type opposite of that of the semiconductor wafer. The termination charge region is adjacent to at least one guard ring in the semiconductor wafer.

18 Claims, 9 Drawing Sheets

(51) Int. Cl.
*H01L 29/06* (2006.01)
*H01L 29/40* (2006.01)
*H01L 29/66* (2006.01)
*H01L 29/739* (2006.01)

(52) U.S. Cl.
CPC ...... *H01L 29/0649* (2013.01); *H01L 29/0696* (2013.01); *H01L 29/402* (2013.01); *H01L 29/408* (2013.01); *H01L 29/66333* (2013.01); *H01L 29/66348* (2013.01); *H01L 29/7395* (2013.01); *H01L 29/7397* (2013.01)

(58) Field of Classification Search
CPC ......... H01L 29/66325; H01L 29/66333; H01L 29/7393; H01L 29/7395; H01L 29/408
USPC .................................. 257/139, 398, 399, 409
See application file for complete search history.

(56) References Cited

U.S. PATENT DOCUMENTS

| | | |
|---|---|---|
| 7,768,093 B2 | 8/2010 | Schulze |
| 9,224,806 B2 | 12/2015 | Voss et al. |
| 2005/0212071 A1 | 9/2005 | Yue et al. |
| 2006/0068571 A1 | 3/2006 | Chow et al. |
| 2009/0212373 A1* | 8/2009 | Karino ............... H01L 21/82348 257/369 |
| 2010/0055882 A1 | 3/2010 | Imhoff |
| 2010/0118455 A1 | 5/2010 | Kusunoki |
| 2010/0289032 A1 | 11/2010 | Zhang |
| 2011/0227152 A1* | 9/2011 | Hsu .................... H01L 29/66143 257/334 |
| 2012/0256192 A1 | 10/2012 | Zhang |
| 2013/0020671 A1* | 1/2013 | Lee ........................ H01L 29/407 257/490 |
| 2013/0168761 A1* | 7/2013 | Hsieh ................... H01L 29/407 257/330 |
| 2015/0041946 A1* | 2/2015 | Voss ...................... H01L 29/063 257/488 |
| 2015/0349144 A1 | 12/2015 | Kawano et al. |
| 2016/0005843 A1 | 1/2016 | Hirabayashi et al. |
| 2016/0197171 A1 | 7/2016 | Onozawa et al. |

FOREIGN PATENT DOCUMENTS

| | | |
|---|---|---|
| WO | WO2012138697 A1 | 10/2012 |
| WO | WO2013036723 A1 | 3/2013 |

OTHER PUBLICATIONS

Solid-State Device Research Conference IEEE *Transactions On Electron Devices*; Nov. 1966, pp. 816-817.
Stengl. et al. *Variation of Lateral Doping as a Field Terminator for High-Voltage Power Devices*; IEEE Trans. Electron Devices; vol. ED-33, No. 3; pp. 426-428, 1986.
V.A.K. Temple; *Junction Termination Extension, a New Technique for Increasing Avalanche Breakdown Voltage and Controlling Surface Electric Field in p-n Junction*; IEEE International Electron Debices Meeting Digest; Abstract 20.4; pp. 423-426, 1977.
Conti et al. *Surface Breakdown In Silicon Planar Diodes Equipped With Field Plate*; Solid-State Electronics, vol. 15, 1972, pp. 93-105.

* cited by examiner

őEDGE TERMINATION STRUCTURE HAVING A TERMINATION CHARGE REGION BELOW A RECESSED FIELD OXIDE REGION

The present application claims the benefit of and priority to a provisional patent application entitled "Recessed Field Oxide Planar Edge Termination," Ser. No. 62/026,510 filed on Jul. 18, 2014. The disclosure in this provisional application is hereby incorporated fully by reference into the present application.

BACKGROUND

Edge termination structures are commonly utilized in semiconductor wafers for balancing the electric field on the peripheral regions of one or more active cells. In absence of an appropriate edge termination structure, the presence of corners and curvatures of doped regions with an increased density of equipotential lines may substantially increase the possibility of breakdown of the semiconductor material in the peripheral regions.

A conventional edge termination structure may include a field plate overlying a thick field oxide layer on a top surface of a semiconductor substrate, and a junction termination extension under the thick field oxide. Due to the presence of the thick field oxide over the semiconductor substrate, a thick photoresist mask is required to cover both the thick field oxide and the field plate during a subsequent photolithographic process to print or pattern features, such as gate trenches, in the active cells of the semiconductor substrate. The thick photoresist mask may adversely affect the optical resolution of the photolithographic process, which may result in large active cell features in the semiconductor substrate. Large active cell features may adversely affect device performance, such as increasing on-resistance and limiting switching speed. In addition, because the thick field oxide layer is situated above the top surface of the semiconductor substrate, more than one layer of conductive material may be required to form the field plate, thereby increasing manufacturing cost.

Thus, there is a need in the art for a planar edge termination structure that can effectively lower the electric field to prevent breakdown at the edges of a semiconductor substrate, while allowing active cells in the semiconductor substrate to achieve smaller feature sizes, reduced on-resistance and faster switching speed.

SUMMARY

The present disclosure is directed to an edge termination structure having a termination charge region below a recessed field oxide region, substantially as shown in and/or described in connection with at least one of the figures, and as set forth in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
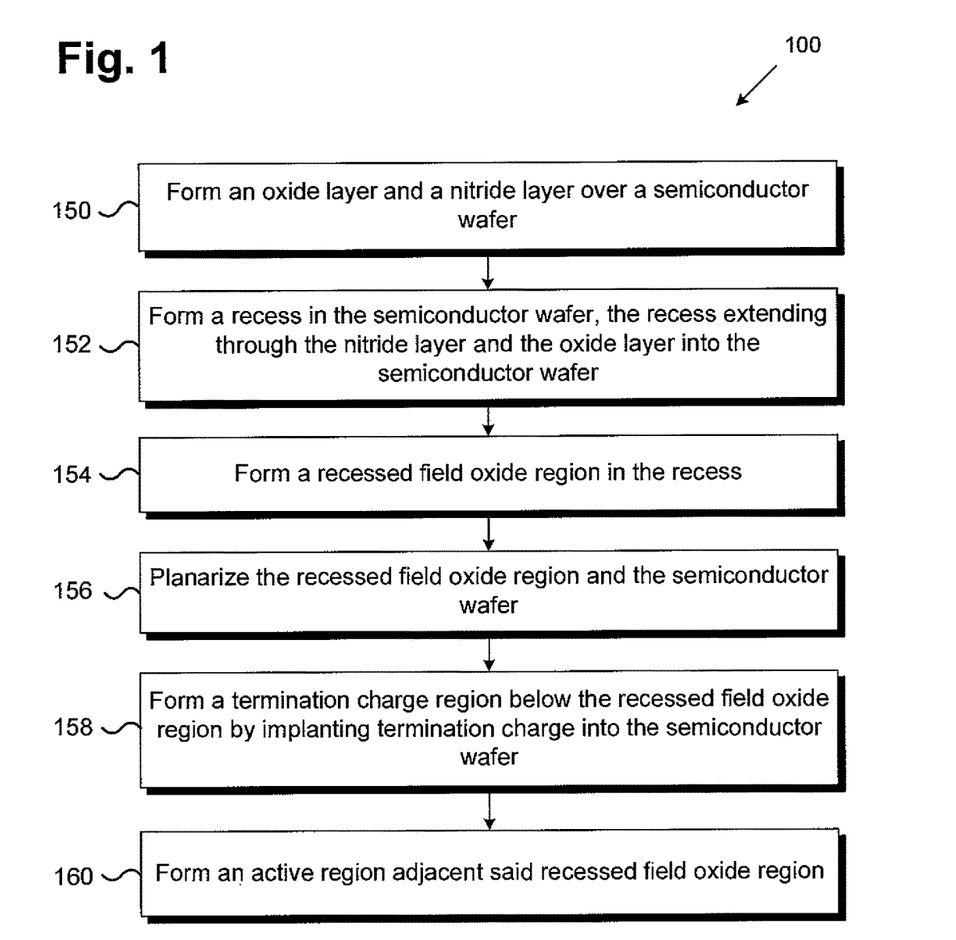
FIG. 1 is a flowchart illustrating a method of forming an edge termination structure according to one implementation of the present application.

FIG. 1 shows a flowchart illustrating an exemplary method of forming an edge termination structure according to an implementation of the present inventive concepts. Certain details and features have been left out of flowchart 100 that are apparent to a person of ordinary skill in the art. For example, an action may consist of one or more subactions or may involve specialized equipment or materials, as known in the art. Actions 150 through 160 indicated in flowchart 100 are sufficient to describe one implementation of the present inventive concepts, other implementations of the present inventive concepts may utilize actions different from those shown in flowchart 100.

In FIGS. 2A through 2F, structures 250 through 260 illustrate the result of performing actions 150 through 160 of flowchart 100, respectively. For example, structure 250 shows a portion of an edge termination structure after processing action 150, structure 252 shows a portion of an edge termination structure after the processing of action 152, structure 254 shows a portion of an edge termination structure after the processing of action 154, and so forth.

Figure 2A:
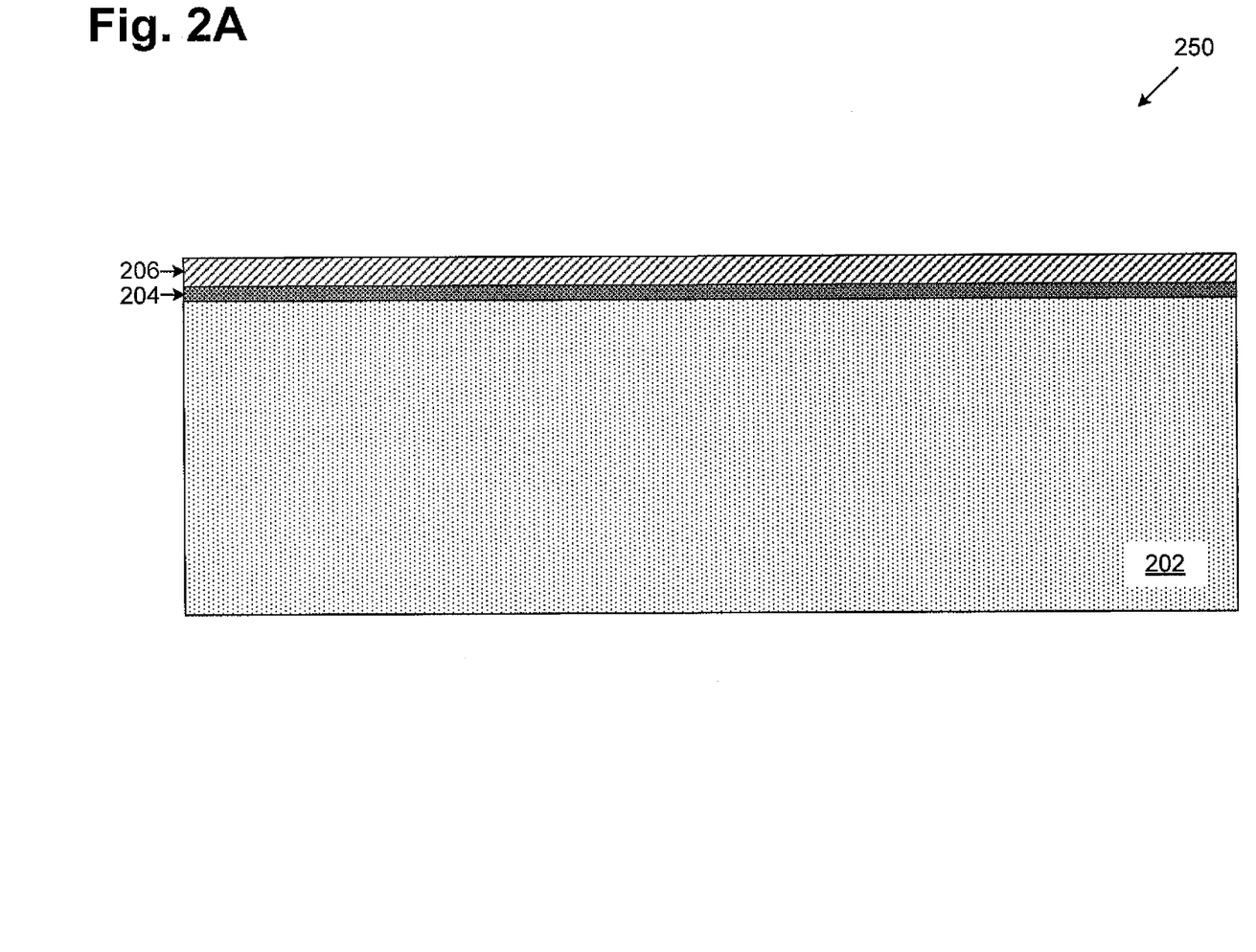
FIG. 2A illustrates a cross-sectional view of a portion of an edge termination structure processed in accordance with an initial action in the flowchart of FIG. 1 according to one implementation of the present application.

Referring to action 150 in FIG. 1 and structure 250 in FIG. 2A, structure 250 shows a portion of an edge termination structure, after completion of action 150 of flowchart 100 in FIG. 1. Specifically, structure 250 includes oxide layer 204 formed over semiconductor wafer 202, and nitride layer 206 formed over oxide layer 204. Semiconductor wafer 202 may include silicon or other appropriate semiconductor material. Semiconductor wafer 202 may include one or more layers. For example, Semiconductor wafer 202 may include a lightly doped layer over a heavily doped layer (not explicitly shown in FIG. 2A). In the present implementation, semiconductor wafer 202 may be of N-type conductivity. In another implementation, semiconductor wafer 202 may be of P-type conductivity.

In structure 250, oxide layer 204 may include silicon dioxide or other appropriate oxide material. Oxide layer 204 may be formed by using any suitable method. For example, in one implementation, oxide layer 204 may be a thin pad oxide layer grown on a top surface of semiconductor wafer 202. In the present implementation, by way of example only, oxide layer 204 may have a thickness of approximately 200-400 Å. In other implementations, oxide layer 206 may have a thickness of less than approximately 200 Å, or greater than approximately 400 Å. Nitride layer 206 may include silicon nitride or other appropriate nitride material. Nitride layer 206 may be formed by using any suitable method. For example, in one implantation, nitride layer 206 may be deposited on oxide layer 204 by chemical vapor deposition (CVD) or low pressure chemical vapor deposition (LP-CVD). In the present implementation, by way of example only, nitride layer 206 may have a thickness of approximately 1000-1500 Å. In other implementations, nitride layer 206 may have a thickness of less than approximately 1000 Å, or greater than approximately 1500 Å.

Figure 2B:
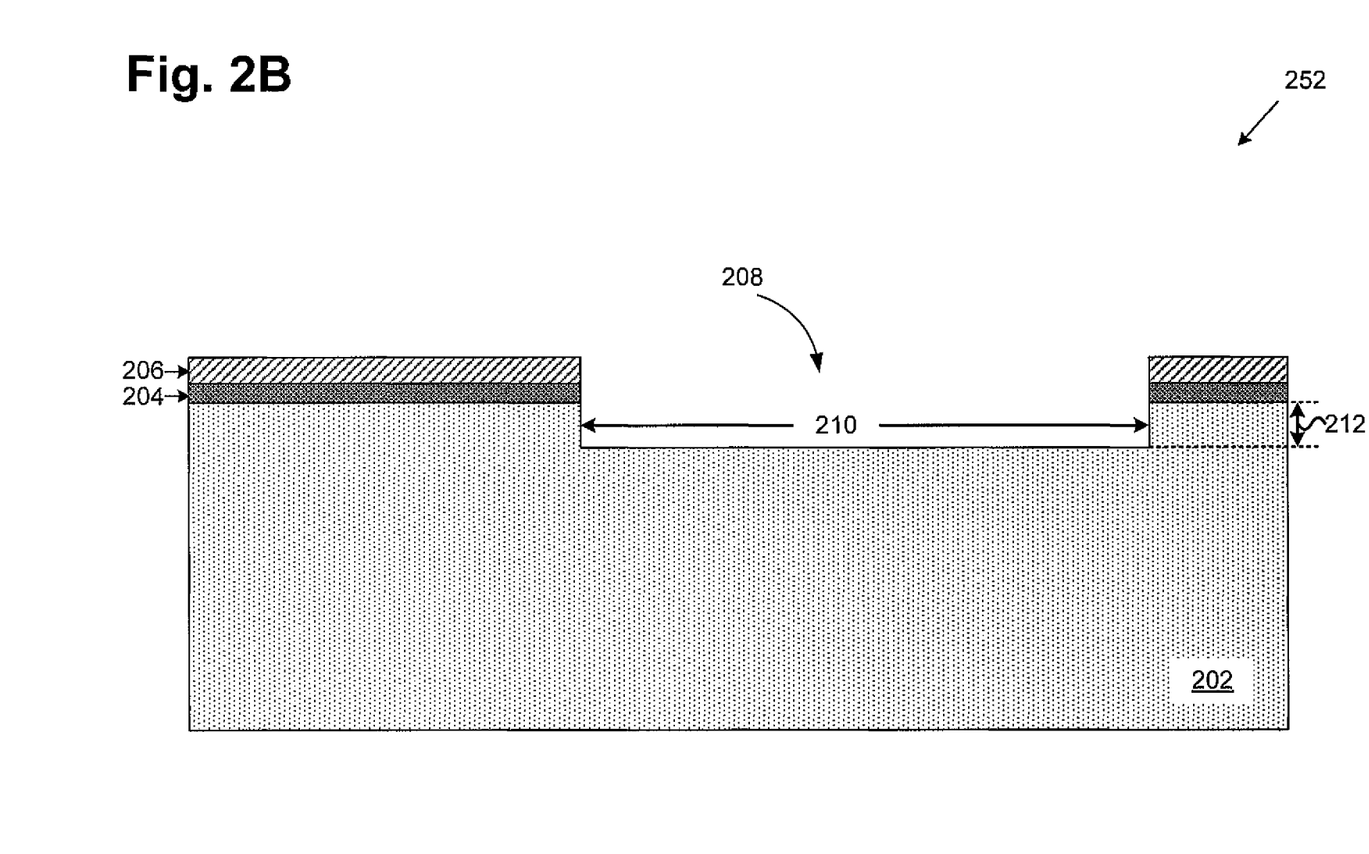
FIG. 2B illustrates a cross-sectional view of a portion of an edge termination structure processed in accordance with an intermediate action in the flowchart of FIG. 1 according to one implementation of the present application.

Referring to action 152 in FIG. 1 and structure 252 in FIG. 2B, structure 252 shows a portion of an edge termination structure after completion of action 152 of flowchart 100 in FIG. 1. Specifically, structure 252 includes recess 208 formed in semiconductor wafer 202, where recess 208 extends through nitride layer 206 and oxide layer 204 into semiconductor wafer 202. In the present implementation, recess 208 may be formed by, for example, using photolithography to define at least one opening in structure 250 in FIG. 2A, and etching nitride layer 206 and oxide layer 204 into semiconductor wafer 202. For example, etchants, such as $CHF_3/CF_4/O_2$ or $AR/CF_4/CHF_3$, may be employed for etching nitride layer 206 (e.g., $Si_3N_4$) and/or oxide layer 204 (e.g., $SiO_2$). Also, etchants, such as $HBr/Cl_2/CF_4$, may be employed for etching semiconductor wafer 202 (e.g., Si). However, other chemistries and methods may be used for etching nitride layer 206, oxide layer 204 and semiconductor wafer 202.

As shown in FIG. 2B, recess 208 may have depth 212 measured from the top surface of semiconductor wafer 202 to a bottom surface of recess 208. In present implementation, by way of example only, depth 212 of recess 208 may be approximately between 0.3-0.5 microns. In other implementations, depth 212 of recess 208 may be less than approximately 0.3 microns, or greater than approximately 0.5 microns. Recess 208 may have width 210 as the distance between the sidewalls of recess 208. In present implementation, by way of example only, width 210 of recess 208 may be approximately between 1-1000 microns. In other implementations, width 210 of recess 208 may be less than approximately 1 microns, or greater than approximately 1000 microns. Referring to action 154 in FIG. 1 and structure 254 in FIG. 2C, structure 254 shows a portion of an edge termination structure after completion of action 154 of flowchart 100 in FIG. 1. Specifically, structure 254 includes recessed field oxide region 214 formed in recess 208 in semiconductor wafer 202. In the present implementation, recessed field oxide region 214 may include silicon dioxide or other appropriate oxide material. Recessed field oxide region 214 may be formed by using any suitable method. In one implementation, recessed field oxide region 214 may be thermally grown in recess 208. For example, a filler material, such as polysilicon, epitaxial silicon or amorphous silicon, may be formed in recess 208 of semiconductor wafer 202. Subsequently, semiconductor wafer 202 may be placed in a high temperature environment for a thermal oxidation treatment so such at least a portion of the filler material is oxidized and converted into a thermal oxide, such as recessed field oxide region 214.

Figure 2C:
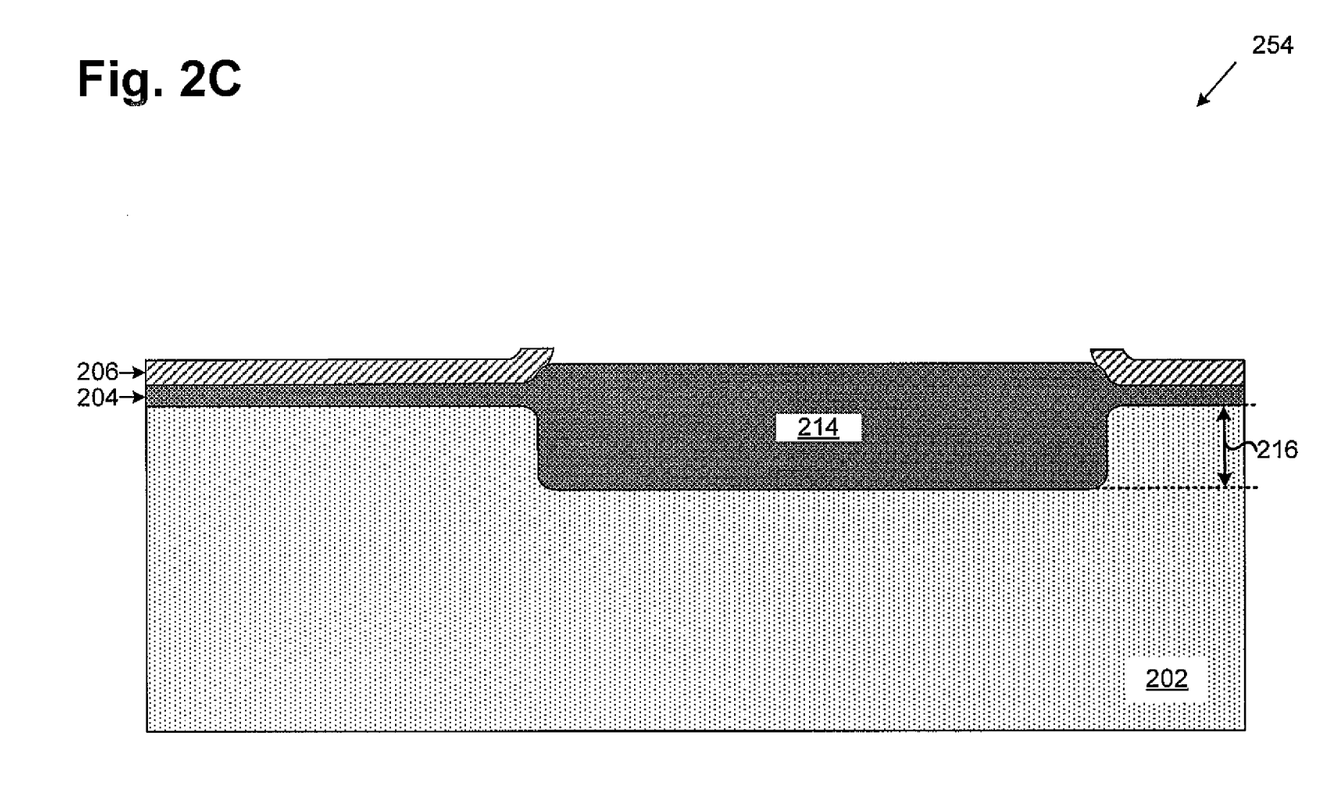
FIG. 2C illustrates a cross-sectional view of a portion of an edge termination structure processed in accordance with an intermediate action in the flowchart of FIG. 1 according to one implementation of the present application.

It is noted that, during the thermal oxidation treatment, the filler material in recess 208 and oxide layer 204 near the sidewalls and the top edges of recess 208 may experience volume expansion in various directions as illustrated in FIG. 2C. As a result, nitride layer 206 and oxide layer 204 may experience structural deformation and volume expansion around the top edges of recess 208. Thus, the thicknesses of oxide layer 204 and nitride layer 206 need to be optimized to reduce volume expansion stress during the thermal oxidation treatment to prevent cracking of semiconductor substrate 202. Also, as illustrated in FIG. 2C, recessed field oxide region 214 may expand above the top surface of semiconductor wafer 202 and below the bottom surface of recess 208 into semiconductor wafer 202. As a result, depth 216 is greater than depth 212 of recess 208 in FIG. 2B. In the present implementation, by way of example only, depth 216 of recessed field oxide region 214 may be less than or equal to approximately 1.0 microns. In other implementations, depth 216 of recessed field oxide region 214 may be greater than approximately 1.0 microns.

Figure 2D:
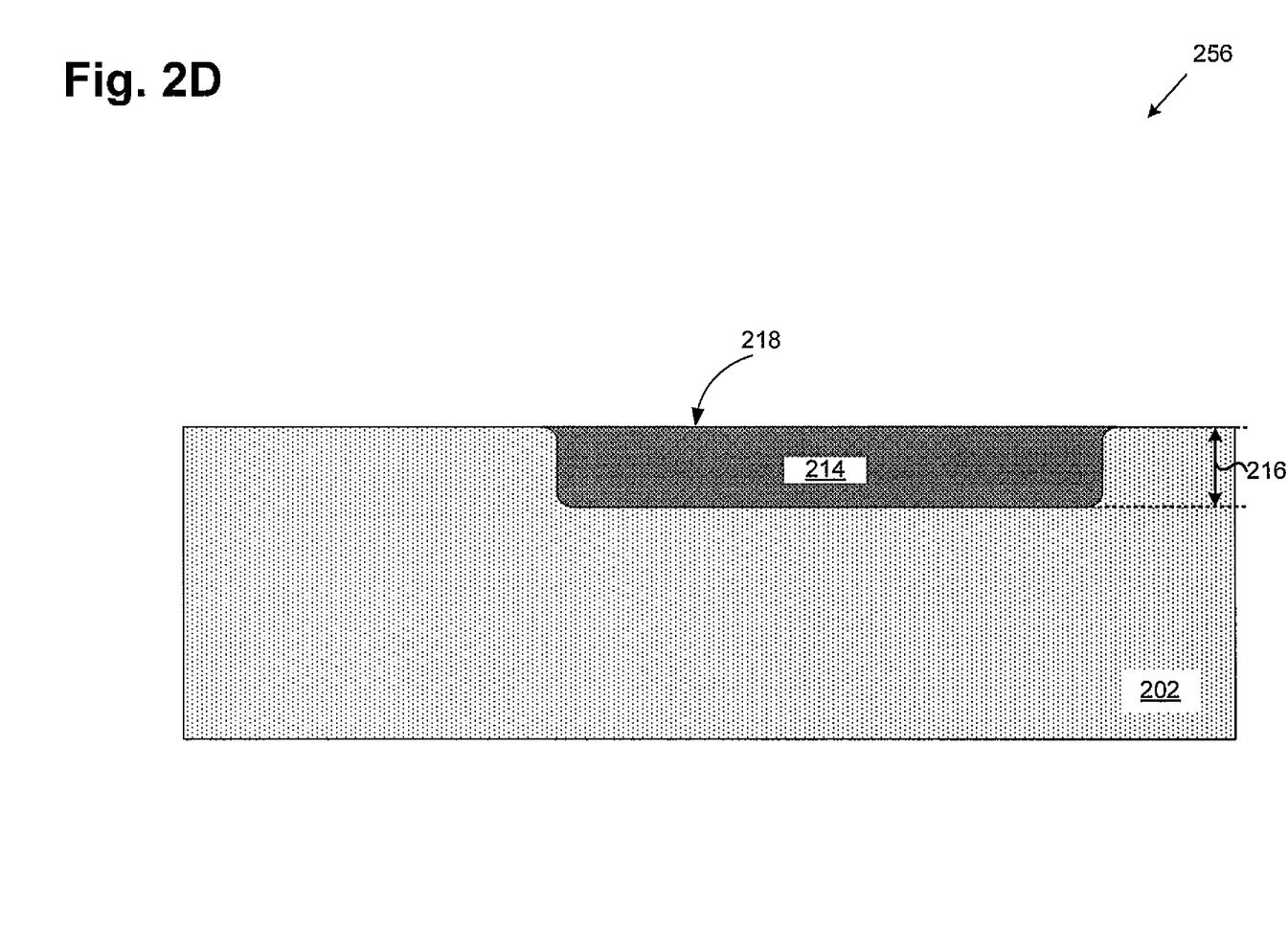
FIG. 2D illustrates a cross-sectional view of a portion of an edge termination structure processed in accordance with an intermediate action in the flowchart of FIG. 1 according to one implementation of the present application.

Referring to action 156 in FIG. 1 and structure 256 in FIG. 2D, structure 256 shows a portion of an edge termination structure after completion of action 156 of flowchart 100 in FIG. 1. Specifically, structure 256 includes planarized recessed field oxide region 214 in recess 208, where planarized recessed field oxide region 214 has coplanar top surface 218 with semiconductor wafer 202. In performing action 156 of flowchart 100, the excess portion of recessed field oxide region 214 above the top surface of semiconductor wafer 202 as appeared in structure 254 of FIG. 2C is removed by, for example, a chemical-mechanical polishing (CMP) process. Additionally, nitride layer 206 and oxide layer 204 may be selectively removed from structure 252 in FIG. 2B by etching, for example, before the CMP process. As such, recessed field oxide region 214 has coplanar top surface 218 with semiconductor wafer 202. By using the CMP process, particles introduced during the deposition and removal of nitride layer 206, oxide layer 204 and/or the filler material for forming recessed field oxide region 214 can be effectively removed from the semiconductor wafer. In other implementations, the excess portion of recessed field oxide region 214 above the top surface of semiconductor wafer 202, nitride layer 206 and oxide layer 204 as appeared in structure 254 of FIG. 2C may be removed by other suitable removal methods without planarization.

According the present inventive concepts, the planarized recessed field oxide region 214 is situated under the top surface of semiconductor wafer 202, as opposed to over the top surface of a semiconductor wafer in conventional edge termination structures. Consequently, a thin photoresist mask can be utilized during a subsequent photolithographic process to achieve better optical resolution. As a result, the planarized wafer surface, such as coplanar top surface 218, enables finer active cell geometries in one or more active cells of semiconductor wafer 202 to be defined using photolithography compared to a device using in a conventional edge termination structure.

Coplanar top surface 218 also enables the subsequent gate polysilicon film to be planarized using, for example, CMP and therefore removes the requirement for any polysilicon to remain above the wafer surface. With this additional planarity improvement, narrower contact widths can be subsequently defined using photolithography. As such, this enables finer cell pitches to be incorporated within the active region adjacent to the edge termination region. Furthermore, in the conventional junction termination extension (JTE) processes, the overlap of the source implant with the gate poly is dependent on poly recess dry etch variation and might cause Vth variations. According to the present inventive concepts, the planarized gate poly, for example, by CMP consistently has little to no recess, thus ensuring good overlap of gate poly and source implant thereby improving the Vth variation.

Figure 2E:
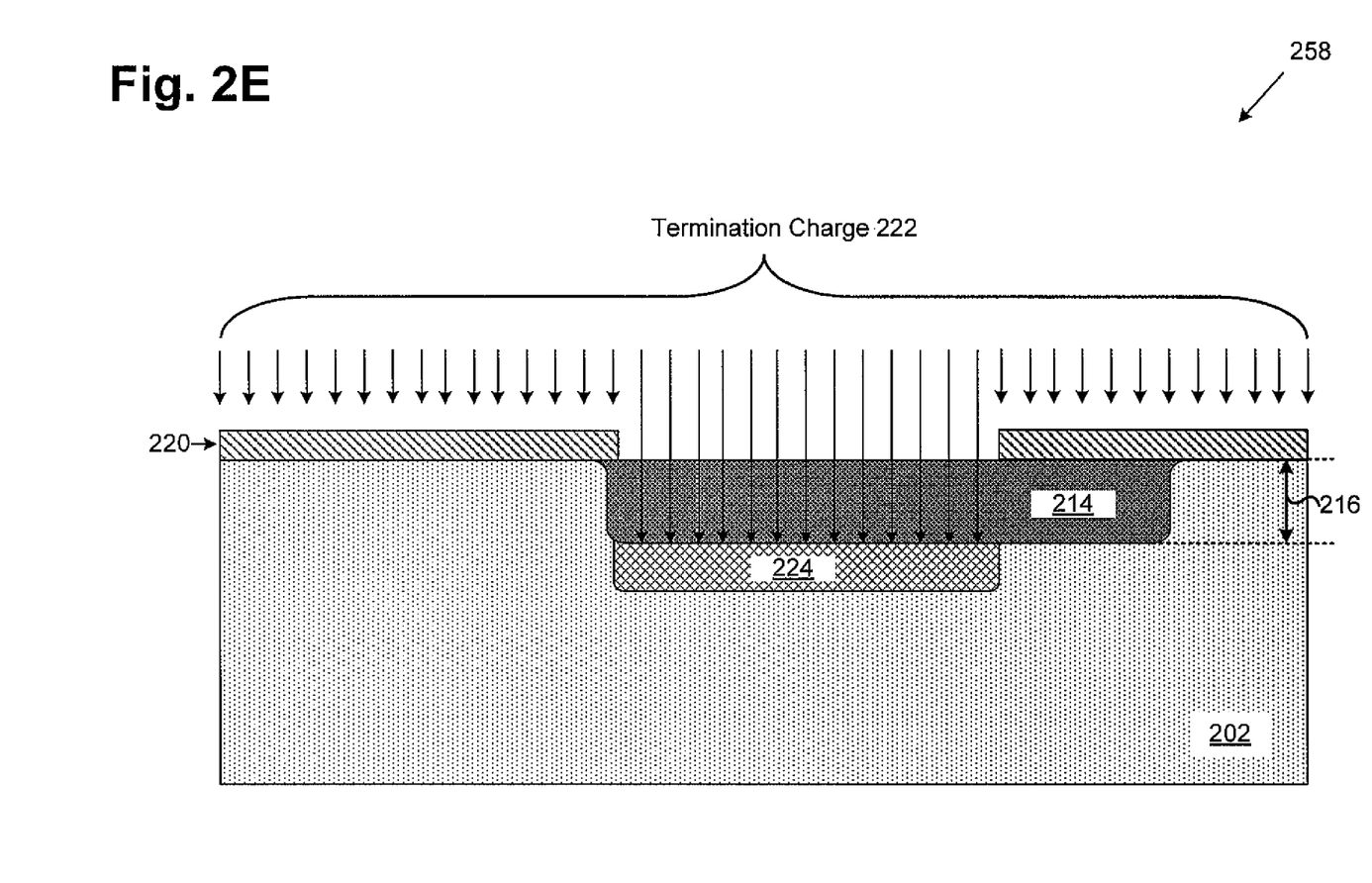
FIG. 2E illustrates a cross-sectional view of a portion of an edge termination structure processed in accordance with an intermediate action in the flowchart of FIG. 1 according to one implementation of the present application.

Referring to FIG. 2E, structure 258 of FIG. 2E shows a portion of an edge termination structure after completion of action 158 of flowchart 100 in FIG. 1. Specifically, structure 258 includes termination charge region 224 below recessed field oxide region 214 in semiconductor wafer 202. For N-type semiconductor wafer 202, termination charge 222 includes P-type implant, such as boron implant or the like, to form termination charge region 224. For P-type semiconductor wafer 202, termination charge 222 includes N-type implant, such as phosphorus implant or the like, to form termination charge region 224.

As shown in FIG. 2E, photoresist mask 220 is used to cover portions of semiconductor wafer 202 and recessed field oxide region 214 during the formation of termination charge region 224. In the present implementation, termination charge 222 is a high-energy implant, and may be applied at an implant energy of greater than or equal to approximately 500 KeV, for example. It is noted that the ion energy level for implanting termination charge 222, such as high energy boron ions, needs to be sufficiently high to penetrate through recessed field oxide region 214 to reach near the interface between recessed field oxide region 214 and semiconductor wafer 202 at depth 216. The high energy implant after the formation of recessed field oxide region 214 allows for good control of the termination charge in termination charge region 224. In other implementations, termination charge 222 may be applied at an implant energy less than approximately 500 KeV to suit the needs of specific applications.

As illustrated in FIG. 2E, in the present implementation, termination charge 222 is substantially uniformly implanted across termination charge region 224 in the window formed by patterned photoresist mask 220. For example, termination charge region 224 has a substantially constant depth profile under recessed field oxide region 214. In the present implementation, termination charge region 224 may have a doping concentration between approximately $1*e^{12}/cm^3$ and approximately $3*e^{12}/cm^3$. In another implementation, termination charge region 224 may include a gradient concentration and/or a variable depth profile under recessed field oxide region 214. It is noted that termination charge region 224 is relatively lightly doped to, for example, overwhelm the surface charges to substantially eliminate the parasitic conduction layer and depletion regions in semiconductor wafer 202. Termination charge region 224 may be part of a junction termination extension for one or more active cells in semiconductor wafer 202, as discussed below with reference to FIG. 2F.

Figure 2F:
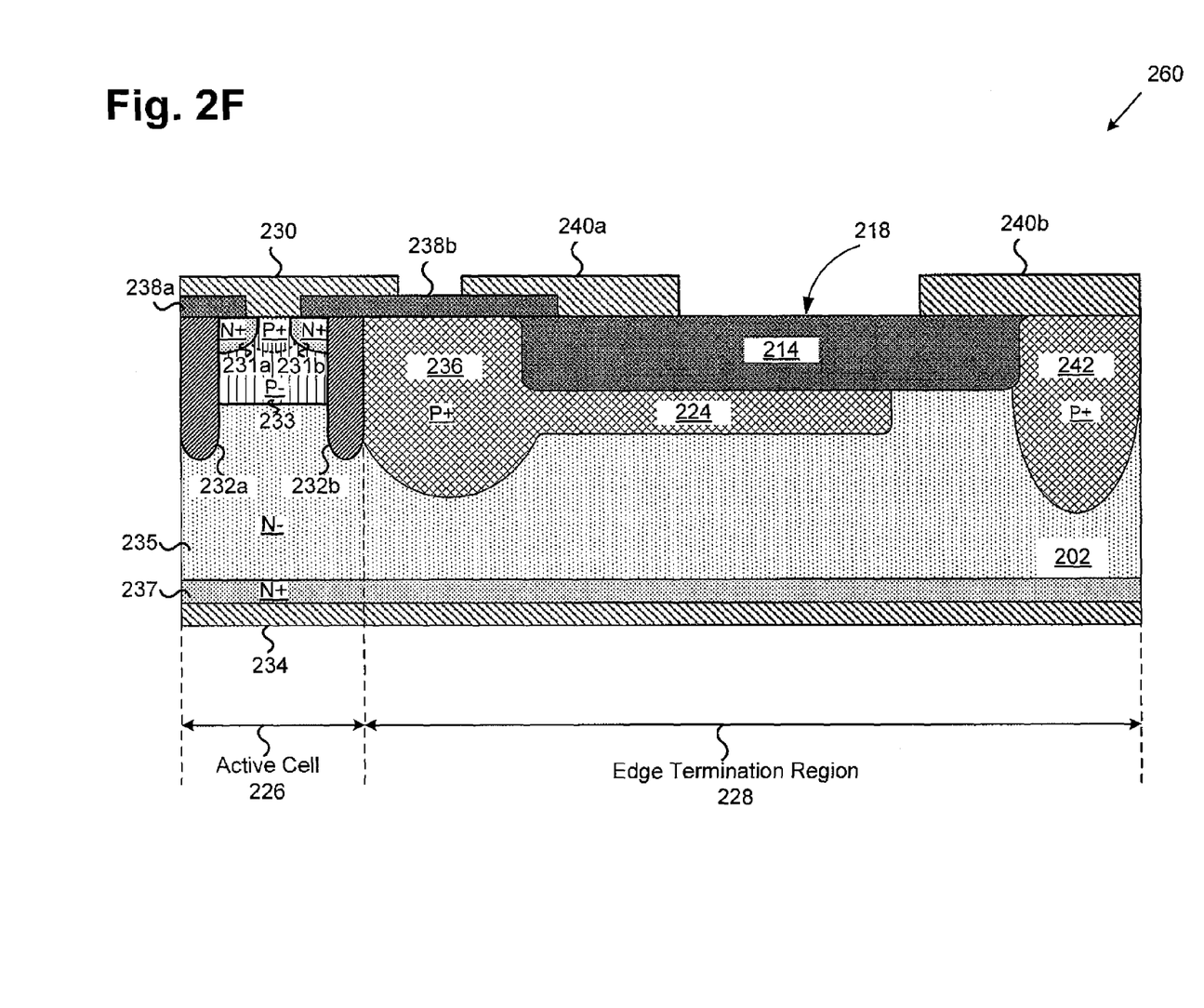
FIG. 2F illustrates a cross-sectional view of a portion of an edge termination structure processed in accordance with a final action in the flowchart of FIG. 1 according to one implementation of the present application.

Referring to FIG. 2F, structure 260 of FIG. 2F shows a portion of an edge termination structure after completion of action 160 of flowchart 100 in FIG. 1. Specifically, structure 260 includes active cell 226 and edge termination region 228 in semiconductor wafer 202. For example, for N-type semiconductor wafer 202, active cell 226 includes first power electrode 230, N+ conductive regions 231a and 231b, trenched gates 232a and 232b, P− body region 233, N− drift region 235, N+ conductive region 237, dielectric segments 238a and 238b, and second power electrode 234. For example, for N-type semiconductor wafer 202, edge termination region 228 includes recessed field oxide region 214, termination charge region 224, P+ doped region 236, dielectric segment 238b, field plates 240a and 240b, and P+ doped region 242. It should be understood that for P-type semiconductor wafer 202, the above-mentioned features in active cell 226 and edge termination region 228 may each have the opposite conductivity type. For example, in the case of P-type semiconductor wafer 202, conductive region 237 may have a P+ conductivity type.

As shown in FIG. 2F, active cell 226 includes first power electrode 230, N+ conductive regions 231a and 231b, trenched gates 232a and 232b, P− body region 233, N− drift region 235, N+ conductive region 237, dielectric segments 238a and 238b, and second power electrode 234. N+ conductive regions 231a and 231b are in P− body region 233 and electrically connected to first power electrode 230. N+ conductive regions 231a and 231b are adjacent to trenched gates 232a and 232b, respectively. Trenched gates 232a and 232b each extend through P− body region 233 into N− drift region 235. Trenched gates 232a and 232b may each be an isolated gate having a conductive filler isolated by a dielectric liner (not explicitly shown in FIG. 2F) inside the trench. N+ conductive region 237 is under N− drift region 235 and electrically connected to second power electrode 234. It is noted that, in one implementation, N+ conductive region 237 may be formed before the formation of recessed field oxide region 214. As can be seen in FIG. 2F, trenched gates 232a and 232b may be electrically isolated from first power electrode 230 respectively by dielectric segments 238a and 238b, which are fonned on coplanar top surface 218 of semiconductor wafer 202.

In the present implementation, active cell 226 may include a power semiconductor device, such as an insulated-gate bipolar transistor (IGBT), in which case, N+ conductive regions 231a and 231b may be emitter regions, first power electrode 230 may be an emitter electrode, N+ conductive region 237 may be a collector region, and second power electrode 234 may be a collector electrode. In another implementation, active cell 226 may include a power semiconductor device, such as a power MOSFET, in which case, N+ conductive regions 231a and 231b may be source regions, first power electrode 230 may be a source electrode, N+ conductive region 237 may be a drain region, and second power electrode 234 may be a drain electrode. In other implementations, active cell 226 may include other power semiconductor devices, such as Thyristor structures. Although FIG. 2F shows structuring 260 having vertical conduction power semiconductor devices in active cell 226, it should be understood that active cell 226 may include lateral conduction power semiconductor devices.

As discussed above, since recessed field oxide region 214 is formed under coplanar top surface 218 of semiconductor wafer 202, a thin photoresist mask may be used in a photolithographic process during the formation of features, such as trenched gates 232a and 232b, in active cell 226, thereby substantially improving optical resolution of the photolithographic process. As a result, substantially smaller active cell features can be formed in active cell 226, thereby improving device performance in active cell 226, such as reducing on-resistance and increasing switching speed.

As shown in FIG. 2F, edge termination region 228 includes recessed field oxide region 214, termination charge region 224, P+ doped region 236, dielectric segment 238b, field plates 240a and 240b, and P+ doped region 242. P+ doped region 236 may be a deep P+ region formed in semiconductor wafer 202 using any suitable method, such as diffusion or implantation. As shown in FIG. 2F, P+ doped region 236 may extend deeper into semiconductor wafer 202 than trenched gate 232b, for example.

In the present implementation, P+ doped region 236 may be situated between trenched gate 232b and recessed field oxide region 214. For example, P+ doped region 236 may be a guard ring surrounding active cell 226. As shown in FIG. 2F, P+ doped region 236 may be in direct contact with termination charge region 224 to form a junction termination extension (JTE) edge termination structure in semiconductor wafer 202, for example. As such, P+ doped region 236 and termination charge region 224 may surround active cell 226 to reduce parasitic charges by spreading the equipotential lines or depletion region near the oxide-semiconductor interface, for example, thereby lowering the electric field.

As shown in FIG. 2F, field plates 240a and 240b are also formed on coplanar top surface 218 with semiconductor wafer 202 to further spread the electric field from the interface of active cell 226 and edge termination region 228 to the outer edge of semiconductor wafer 202. At the interface of active cell 226 and edge termination region 228, P+ doped region 236 may be situated below dielectric segment 238b between the right edge of first power electrode 230 and the left edge of field plate 240a, where portions of first power electrode 230 and field plate 240a overlap P+ doped region 236. As shown in FIG. 2F, field plate 240b is formed over a portion of recessed field oxide region 214 and P+ doped region 242, which functions as a channel stop at the outer edge of semiconductor wafer 202.

Figure 3:
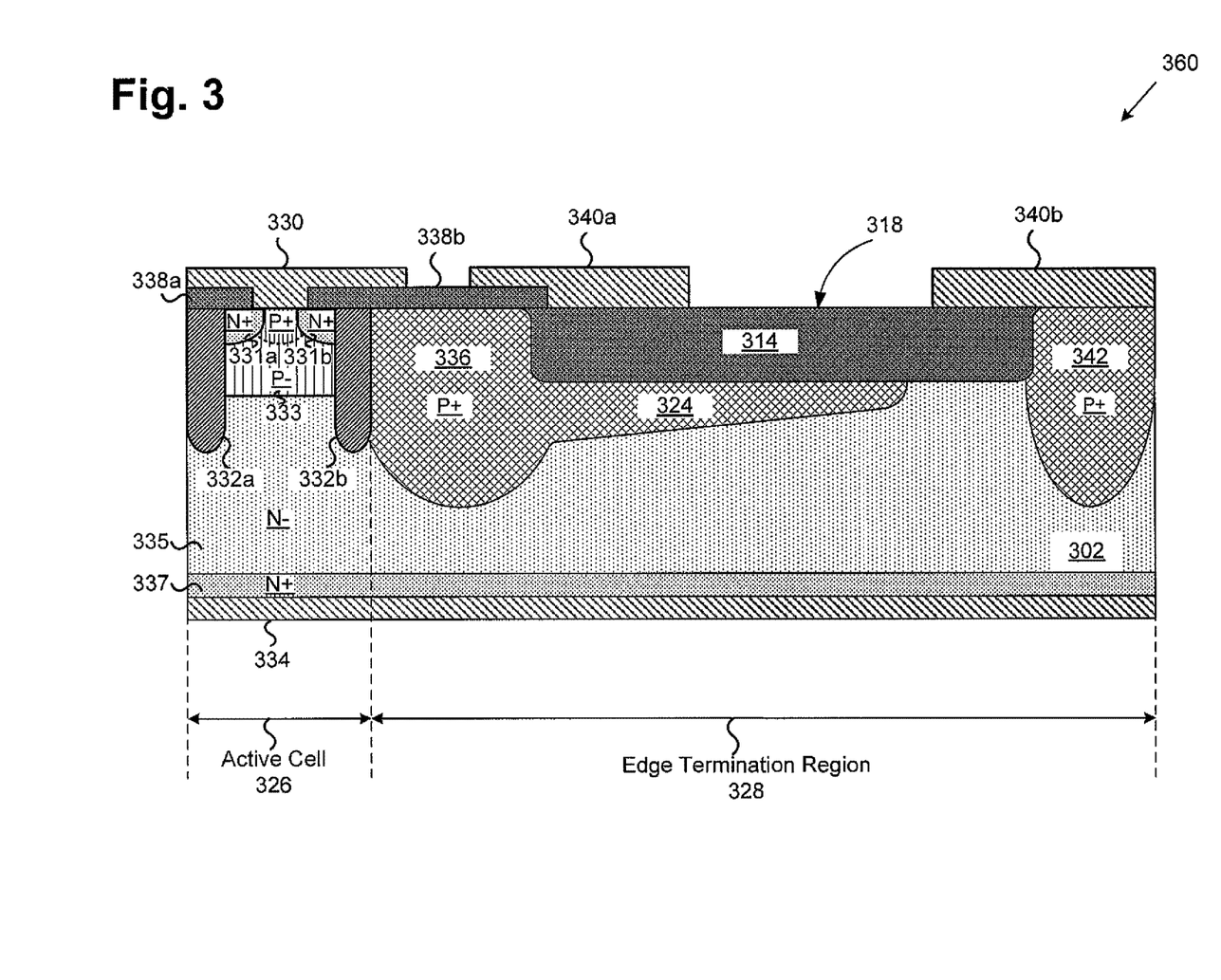
FIG. 3 illustrates a cross-sectional view of a portion of an edge termination structure according to one implementation of the present application.

Referring to FIG. 3, structure 360 illustrates a portion of an edge termination structure having a variation in lateral doping (VLD), according to one implementation of the present application. Specifically, with similar numerals representing similar features in FIG. 2F, structure 360 includes active cell 326 and edge termination region 328 in semiconductor wafer 302. For example, for N-type semiconductor wafer 302, active cell 326 includes first power electrode 330, N+ conductive regions 331a and 331b, trenched gates 332a and 332b, P- body region 333, N- drift region 335, N+ conductive region 337, dielectric segments 338a and 338b, and second power electrode 334. For example, for N-type semiconductor wafer 302, edge termination region 328 includes recessed field oxide region 314, termination charge region 324, P+ doped region 336, dielectric segment 338b, field plates 340a and 340b, and P+ doped region 342. It should be understood that for P-type semiconductor wafer 302, the above-mentioned features in active cell 326 and edge termination region 328 may each have the opposite conductivity type. For example, in the case of P-type semiconductor wafer 302, conductive region 337 may have a P+ conductivity type.

It is noted that, in structure 360, termination charge region 324 may have a variable depth profile under recessed field oxide region 314. For example, termination charge region 324 having a variable depth profile may be formed by using photoresist mask 220 to mask a portion of recessed field oxide region 214 at a time, each time implanting termination charge (e.g., termination charge 222 in FIG. 2E) with a gradually decreasing concentration and/or depth, along the lateral direction of termination charge region 324. As a result, a variable depth profile, such as an effective gradation in doping level and/or depth, can be achieved in termination charge region 324. It should be understood that, in this implementation, since multiple implants are used, one ore more temperature steps may be required to active the implants.

Similar to structure 260 in FIG. 2F, recessed field oxide region 314 is situated under coplanar top surface 318 of semiconductor wafer 302, as opposed to above the top surface of a semiconductor wafer in conventional edge termination structures. As such, a thin photoresist mask can be utilized during a subsequent photolithographic process, thereby substantially improving optical resolution during the formation of features, such as trenched gates 332a and 332b, in active cell 326, resulting in substantially smaller active cell features. As a result, substantially smaller active cell features can be formed in active cell 326, thereby improving device performance in active cell 326, such as reducing on-resistance and increasing switching speed.

Figure 4:
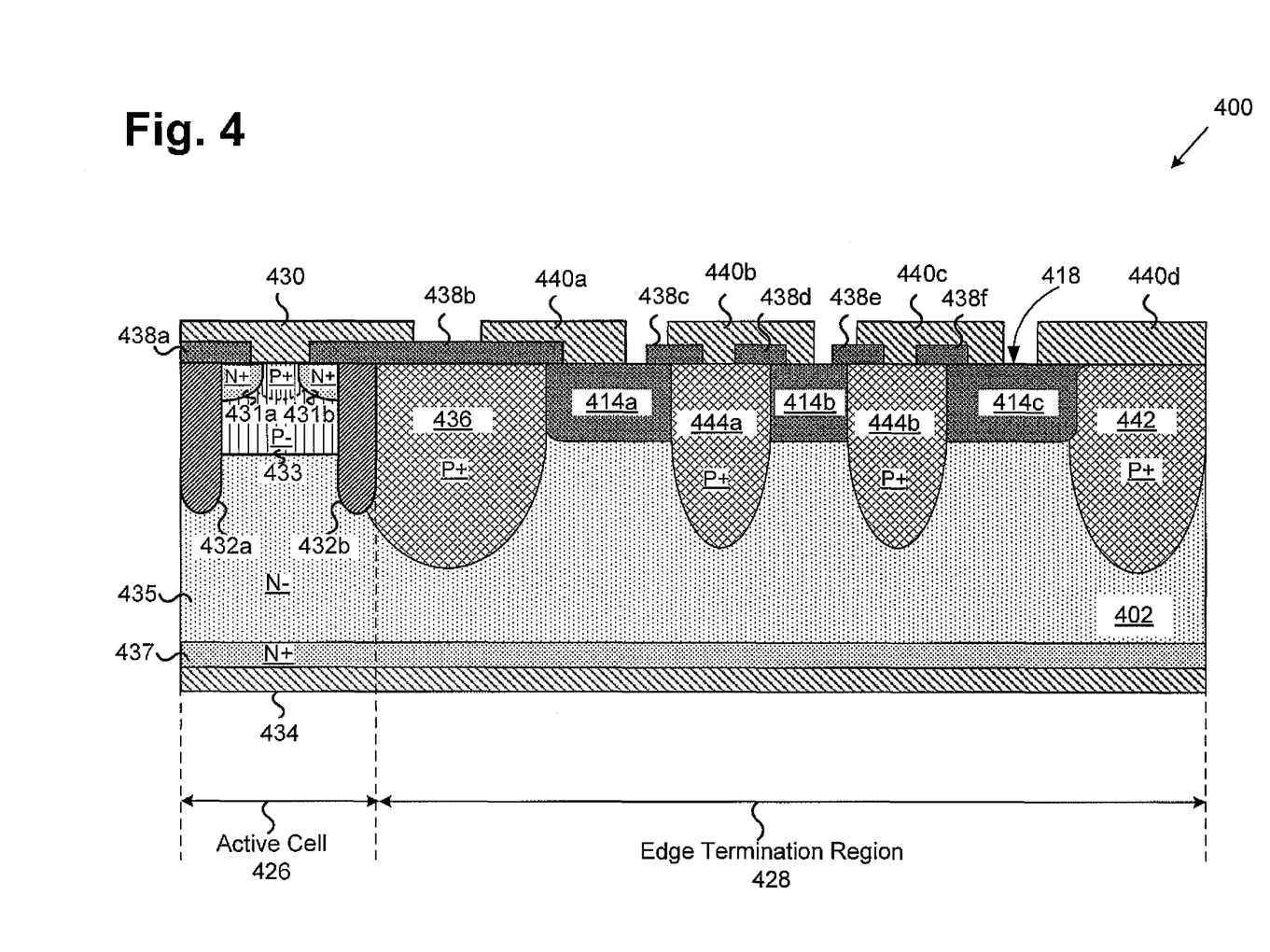
FIG. 4 illustrates a cross-sectional view of a portion of an edge termination structure according to one implementation of the present application.

Referring to FIG. 4, structure 400 illustrates a portion of an edge termination structure having guard rings, according to one implementation of the present application. Specifically, with similar numerals representing similar features in FIG. 2F, structure 400 includes active cell 426 and edge termination region 428 in semiconductor wafer 402. For example, for N-type semiconductor wafer 402, active cell 426 includes first power electrode 430, N+ conductive regions 431a and 431b, trenched gates 432a and 432b, P- body region 433, N- drift region 435, N+ conductive region 437, dielectric segments 438a, 438b, 438c, 438d, 438e and 438f, and second power electrode 434. For example, for N-type semiconductor wafer 402, edge termination region 428 includes recessed field oxide regions 414a, 414b and 414c, P+ doped region 436, dielectric segment 438b, field plates 440a, 440b, 440c and 440d, P+ guard rings 444a and 444b, and P+ doped regions 442. It should be understood that for P-type semiconductor wafer 402, the above-mentioned features in active cell 426 and edge termination region 428 may each have the opposite conductivity type. For example, in the case of P-type semiconductor wafer 402, conductive region 437 may have a P+ conductivity type.

As shown in FIG. 4, in structure 400, recessed field oxide regions 414a, 414b and 414c may be formed in semiconductor wafer 402, using fabrication process described in actions 150 through 156 in flowchart 100 of FIG. 1. Instead of forming a termination charge region under a recessed field oxide region, as described in action 158 of flowchart 100, P+ guard rings 444a and 444b are formed in edge termination region 428 between recessed field oxide regions 414a, 414b and 414c. For example, P+ guard ring 444a may be situated between recessed field oxide regions 414a and 414b, and P+ guard ring 444b may be situated between recessed field oxide regions 414b and 414c. A top surface of each of recessed field oxide regions 414a, 414b and 414c are substantially coplanar with a top surface of each of P+ guard rings 444a and 444b, which are also substantially coplanar with coplanar top surface 418 of semiconductor wafer 402. P+ guard rings 444a and 444b may be concentric guard rings surrounding active cell 426. In the present implementation, P+ guard rings 444a and 444b may be tied to an electric potential. In another implementation, P+ guard rings 444a and 444b may not be tied to an electric potential, thereby forming floating field limiting rings, for example.

P+ guard rings 444a and 444b may be formed by using any suitable method, such as diffusion or implantation, in semiconductor wafer 402. As shown in FIG. 4, P+ guard rings 444a and 444b may extend into N- drift region 435 of semiconductor wafer 402. It is noted that P+ guard rings 444a and 444b may be formed using appropriate dosage and energy levels tailored to suit specific applications in relevant contexts. Field plates 440*b* and 440*c* are formed over P+ guard rings 444*a* and 444*b*, respectively, to further spread the electric field from the interface of active cell 426 and edge termination region 428 to the outer edge of semiconductor wafer 402.

According the present inventive concepts, the planarized recessed field oxide regions 414*a*, 414*b* and 414*c* are situated under coplanar top surface 418 of semiconductor wafer 402, as opposed to above the top surface of a semiconductor wafer in conventional edge termination structures. As such, a thin photoresist mask can be utilized during a subsequent photolithographic process, thereby substantially improving optical resolution during the formation of features, such as trenched gates 432*a* and 432*b*, in active cell 426, resulting in substantially smaller active cell features. As a result, substantially smaller active cell features can be formed in active cell 426, thereby improving device performance in active cell 426, such as reducing on-resistance and increasing switching speed.

According to the present inventive concepts, an edge termination structure includes an edge termination region with a recessed field oxide region in semiconductor wafer, where the recessed field oxide region has a coplanar top surface with the semiconductor wafer. High energy termination charge implantation, for example, using high energy boron implant, after the formation of recessed field oxide region may improve termination charge control and breakdown stability. The planarized wafer surface with the recessed field oxide region enables finer active cell geometries to be defined using photolithography compared to a device using conventional JTE processes.

The planarized wafer surface also allows the subsequent gate polysilicon film to be planarized using, for example, CMP and therefore removes the requirement for any polysilicon to remain above the wafer surface. With this additional planarity improvement, narrower contact widths can be subsequently defined using photolithography. Again this enables finer cell pitches to be incorporated within the active region adjacent to the edge termination region. Furthermore, in the conventional JTE processes, the overlap of the source implant with the gate poly is dependent on poly recess dry etch variation and might cause Vth variations. According to the present inventive concepts, the planarized gate poly, for example by CMP, consistently has little to no recess, thus ensuring good overlap of gate poly and source implant thereby improving the Vth variation.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. An edge termination structure, comprising:
an active cell in a semiconductor substrate, said active cell including a trenched gate having a conductive filler isolated by a dielectric liner inside said trenched gate;
a recess in said semiconductor substrate;
an edge termination region adjacent said active cell in said semiconductor substrate;
wherein said edge termination region includes a recessed field oxide region, a termination charge region below said recessed field oxide region, and a P+ doped region disposed between said trenched gate and said recessed field oxide region;
wherein said P+ doped region extends deeper into said semiconductor substrate than said termination charge region; and
wherein said recessed field oxide region completely fills said recess.

2. The edge termination structure of claim 1, wherein a top surface of said recessed field oxide region is substantially coplanar with a top surface of said semiconductor substrate.

3. The edge termination structure of claim 1, wherein said semiconductor substrate comprises silicon.

4. The edge termination structure of claim 1, wherein said recessed field oxide region comprises silicon dioxide.

5. The edge termination structure of claim 1, wherein said active cell comprises at least one insulated-gate bipolar transistor surrounded by said edge termination region in said semiconductor substrate.

6. The edge termination structure of claim 1, wherein said termination charge region has a conductivity type opposite of that of said semiconductor substrate.

7. The edge termination structure of claim 1, wherein said termination charge region is adjacent to at least one guard ring in said semiconductor substrate.

8. The edge termination structure of claim 1, wherein said termination charge region has a substantially constant depth profile under said recessed field oxide region.

9. The edge termination structure of claim 1, wherein said termination charge region has a variable depth profile under said recessed field oxide region.

10. The edge termination structure of claim 1, wherein a width of said recessed field oxide region is at least 3 times greater than a depth of said recessed field oxide region.

11. The edge termination structure of claim 10, wherein said depth of said recessed field oxide region is between approximately 0.3 to 0.5 microns, and wherein said width of said recessed field oxide region is between approximately 1 to 1000 microns.

12. The edge termination structure of claim 1, wherein said P+ doped region extends deeper into said semiconductor substrate than said trenched gate.

13. The edge termination structure of claim 1, wherein said P+ doped region forms a guard ring surrounding said active cell.

14. The edge termination structure of claim 1, wherein said P+ doped region directly contacts said termination charge region to form a junction termination extension edge termination structure in said semiconductor substrate.

15. The edge termination structure of claim 1, wherein said edge termination region further includes a plurality of field plates formed on a top surface of said semiconductor substrate.

16. The edge termination structure of claim 15, wherein a first one of said field plates extends onto a dielectric segment formed on said top surface of said semiconductor substrate in a lateral direction towards said active cell, and wherein said P+ doped region is disposed below said dielectric segment between an inner edge of said first field plate and an outer edge of a power electrode disposed in said active cell.

17. The edge termination structure of claim 16, wherein portions of said power electrode and said first field plate overlap said P+ doped region.

18. The edge termination structure of claim 15, wherein said edge termination region further includes an additional P+ doped region disposed at a side of said recessed field oxide region opposite said P+ doped region, and wherein a second one of said field plates is disposed over a portion of said recessed field oxide region and said additional P+ doped region.

* * * * *

UNITED STATES PATENT AND TRADEMARK OFFICE
CERTIFICATE OF CORRECTION

PATENT NO. : 9,899,477 B2
APPLICATION NO. : 14/790905
DATED : February 20, 2018
INVENTOR(S) : R. Turner et al.

It is certified that error appears in the above-identified patent and that said Letters Patent is hereby corrected as shown below:

On the Title Page

Page 2/other publications (Line 9), please change "Debices" to -- Devices --.

Signed and Sealed this
Seventeenth Day of April, 2018

Andrei Iancu
*Director of the United States Patent and Trademark Office*